(12) United States Patent
Park et al.

(10) Patent No.: US 9,093,647 B2
(45) Date of Patent: Jul. 28, 2015

(54) OLED DISPLAY AND METHOD OF FABRICATING THE SAME

(75) Inventors: Hongki Park, Kyungi-do (KR); Yongpal Park, Kyungnam (KR); Kyongji Bae, Kyungi (KR)

(73) Assignee: LG Display Co., Ltd., Seoul (KR)

( * ) Notice: Subject to any disclaimer, the term of this patent is extended or adjusted under 35 U.S.C. 154(b) by 371 days.

(21) Appl. No.: 13/154,929

(22) Filed: Jun. 7, 2011

(65) Prior Publication Data
US 2012/0097926 A1   Apr. 26, 2012

(30) Foreign Application Priority Data
Oct. 21, 2010  (KR) .................. 10-2010-0103081

(51) Int. Cl.
*H01L 51/54* (2006.01)
*H01L 51/56* (2006.01)
*H01L 51/00* (2006.01)
*H01L 51/50* (2006.01)

(52) U.S. Cl.
CPC ........... *H01L 51/0013* (2013.01); *H01L 51/006* (2013.01); *H01L 51/5012* (2013.01)

(58) Field of Classification Search
None
See application file for complete search history.

(56) References Cited

U.S. PATENT DOCUMENTS

| 6,251,531 | B1 * | 6/2001 | Enokida et al. | 428/690 |
|---|---|---|---|---|
| 2004/0209118 | A1 * | 10/2004 | Seo et al. | 428/690 |
| 2005/0104814 | A1 * | 5/2005 | Choi et al. | 345/76 |
| 2006/0141135 | A1 | 6/2006 | Wang et al. | |
| 2011/0306157 | A1 * | 12/2011 | Wallace et al. | 438/34 |

FOREIGN PATENT DOCUMENTS

| CN | 1771313 | 5/2006 |
|---|---|---|
| KR | 10-2004-043648 A | 5/2004 |

OTHER PUBLICATIONS

Chinese Office Action dated Dec. 9, 2013 for corresponding Patent Application No. 201110320597.4.

* cited by examiner

*Primary Examiner* — J. L. Yang
(74) *Attorney, Agent, or Firm* — Morgan, Lewis & Bockius LLP

(57) ABSTRACT

An OLED (OLED) display is provided with a plurality of pixels in each of the OLEDs, each of the OLEDs comprising a first electrode, an organic emission layer, and a second electrode sequentially formed on a substrate, wherein the organic emission layer comprises a mixture of at least two organic materials, and wherein a difference of sublimation temperatures between the at least two organic materials is set to be less than about 50 ° C.

17 Claims, 13 Drawing Sheets

OLED DISPLAY AND METHOD OF FABRICATING THE SAME

CROSS REFERENCE TO RELATED APPLICATIONS

This application claims the priority benefit of Korea Patent Application No. 10-2010-0103081 filed on Oct. 21, 2010, which is incorporated herein by reference.

FIELD OF THE INVENTION

The present invention relates to an organic light emitting diode (OLED) display and a method of fabricating the same.

BACKGROUND OF THE INVENTION

In recent years, various kinds of flat panel display devices ("FPDs") have been developed to replace the heavy and voluminous cathode ray tube. Such FPDs include, for example, liquid crystal displays ("LCDs"), field emission displays ("FEDs"), plasma display panels ("PDPs"), and electroluminescence displays ("ELDs").

In particular, the PDPs are known to be the most advantageous in implementing a slim, light-weight and large-sized screen because its structure and fabrication process are simple. Nonetheless, the PDPs are also known to be disadvantageous in that they have low luminous efficiency and luminance, and large power consumption. Thus, the thin film transistor (TFT) LCDs instead have been most widely used but are disadvantageous in that they have a narrow viewing angle and a low response speed. The ELDs are largely classified into an inorganic light emitting diode display and an organic light emitting diode display according to materials used in an emission layer. Of the two, the organic light emitting diode display is a self-emitting element and is more advantageous in that it has faster response speed, higher luminous efficiency, and a larger viewing angle.

As shown in FIG. 1, the OLED, which is an organic electron element converting an electric energy into a light energy, has a structure in which organic emission materials for emitting light are placed between an anode electrode ANODE and a cathode electrode CATHODE. Holes are injected from the anode electrode, and electrons are injected from the cathode electrode. The holes and electrons are injected from the electrodes to an organic emission layer EML to form excitons. Specifically, the holes are recombined with the electrons in the organic emission layer EML, and the OLED emits light due to energy generated when the excitons returns to a bottom level. In order to smoothly inject the holes and electrons into the emission layer EML from the electrodes, typically, a hole transport layer HTL and a hole injection layer HIL are placed between the emission layer EML and the anode electrode. Further, an electron transport layer ETL and an electron injection layer EIL are placed between the emission layer EML and the cathode electrode.

For a smooth hole injection, the hole injection layer HIL and the hole transport layer HTL have an HOMO (highest occupied molecular orbital) level which corresponds to the middle level between the emission layer EML and the anode electrode. In addition, for a smooth electron injection, the electron transport layer ETL and the electron injection layer EIL have a LUMO (lowest unoccupied molecular orbital) level which corresponds to the middle level between the cathode electrode and the emission layer, EML. Brightness and efficiency characteristics of the OLED element are determined by the amount of the holes and electrons injected from the anode electrode and cathode electrode into the emission layer EML. The amount of the holes injected from the anode electrode into the emission layer EML and the amount of the electrons injected from the cathode into the emission layer EML are varied depending on an energy level of the organic emission material.

Meanwhile, in the OLED display, for implementation of full colors, the emission layer EML is formed at a position where the OLED is disposed in each of red, green, and blue pixels. The emission layer EML is patterned for each pixel. As methods of forming the emission layer EML, there have been known methods of using a fine metal mask (FMM), an ink jet method, a laser induced thermal imaging (LITI), or the like.

In particular, in the FMM method, red, green, and blue emission materials are patterned for each pixel using a metal fine mask to form red, green, and blue pixels. This method has superiority in terms of element characteristics. It, however, has a low yield due to the phenomenon of the mask blocking, and is hardly applied to a large-sized display device since a large-sized mask is difficult to develop.

The ink jet method is advantageous in that large-sized screen and high definition characteristics and high luminous efficiency can be implemented since the emission layer can be easily formed at selected regions and there is no damage to materials. In the ink jet method, however, there is a need of an accurate adjustment of the amount, the speed, the uniform jetting angle of ink jetted from nozzles. Also, there is a need of development of ink jet heads with a higher speed jetting and an increased number of heads for implementing lower cost and larger-sized screen. Furthermore, quality and thickness of the emission layer must be uniform so as to secure uniform emission in pixels. There, however, appears a so-called coffee stain effect where a periphery portion of the emission layer becomes thicker than a middle portion of the emission layer in a process of drying ink drops, and thus the periphery is thickened.

The laser induced thermal imaging (LITI) is a method in which a light source like a laser is irradiated to a transfer substrate including an organic emission material pattern, a light-to-heat conversion layer, and a support film to transfer the organic emission material pattern on the transfer film onto another substrate, thereby forming an emission layer. Describing this further in detail, in the laser induced thermal imaging, the transfer film provided with red, green, and blue organic emission material patterns is disposed on a substrate provided with black matrices, and thereafter the substrate and the transfer film are aligned and attached to each other. Next, the substrate to which the transfer film is attached is positioned on a stage of a laser irradiation device, and then the stage or a laser head moves from one end of the substrate to the other end thereof to perform a laser scanning. Thereby, a laser beam is sequentially irradiated to the red, green, and blue organic emission material patterns. Accordingly, the organic emission material patterns are sequentially transferred to the respective pixel regions on the substrate.

In the cases where the organic emission layers are formed on the substrate by the use of the laser induced thermal imaging in this way, a series of processes are repeated to form the red, green, and blue organic emission layers, where the respective transfer films corresponding to the red, green, and blue are attached to the substrate, the laser is irradiated thereto in the scanning manner, and then the transfer films are detached. Thus, the repeated fabrication processes cause the process time to be lengthened and the processes to be complicated. Further, there is a problem in that bad patterns are sometimes generated due to micro bubbles in the course of attaching and detaching the respective transfer films of red, green, and blue to the substrate. Also, there is another problem in that edges of the organic emission layers become rough by the repeated irradiation of the laser beam, and the attachment and detachment of the transfer films.

As discussed above, it is difficult to implement an organic emission layer having a high precision to a large-sized screen display using the FMM method, the ink jet or the LITI method.

SUMMARY

Embodiments of the present invention provides an OLED display and a method of fabricating the OLED display capable of implementing large-sized screen and high resolution, in particular improving efficiency, color-property and life-time of an OLED by uniformly mixing at least two materials when the at least two materials is used to make an organic emission layer.

According to an exemplary embodiment of the present invention, there is provided an OLED display provided with a plurality of pixels in each of the OLEDs, each of the OLEDs comprising a first electrode, an organic emission layer, and a second electrode sequentially formed on a substrate, wherein the organic emission layer comprises a mixture of at least two organic materials, and wherein a difference of sublimation temperatures between the at least two organic materials is set to be less than about 50° C.

BRIEF DESCRIPTION OF THE DRAWINGS

The accompanying drawings, which are included to provide a further understanding of the invention and are incorporated herein and constitute a part of this specification, illustrate exemplary embodiments of the invention and together with the description serve to explain the principles of the invention. In the drawings.

DETAILED DESCRIPTION

Exemplary embodiments of the present invention will now be described with reference to FIGS. 2 to 12.

The following figures, embodiments and Examples have been included to provide guidance to one of ordinary skill in the art for practicing representative embodiments of the presently disclosed subject matter. In light of the present disclosure and the general level of skill in the art, those of skill can appreciate that the following Examples are intended to be exemplary only and that numerous changes, modifications, and/or alterations can be employed without departing from the scope of the presently disclosed subject matter.

Figure 1:
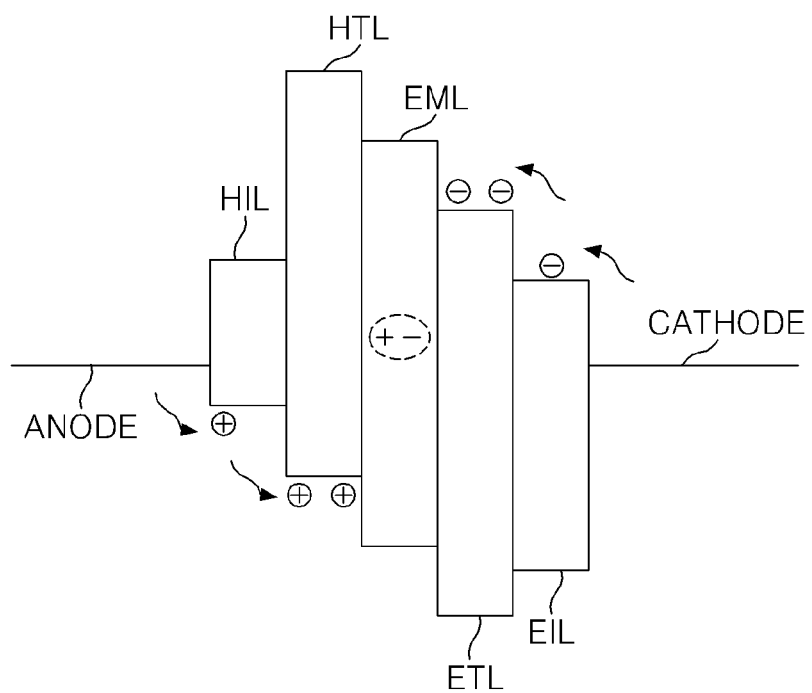
FIG. 1 is a schematic diagram illustrating a structure of an OLED.
Figure 2:
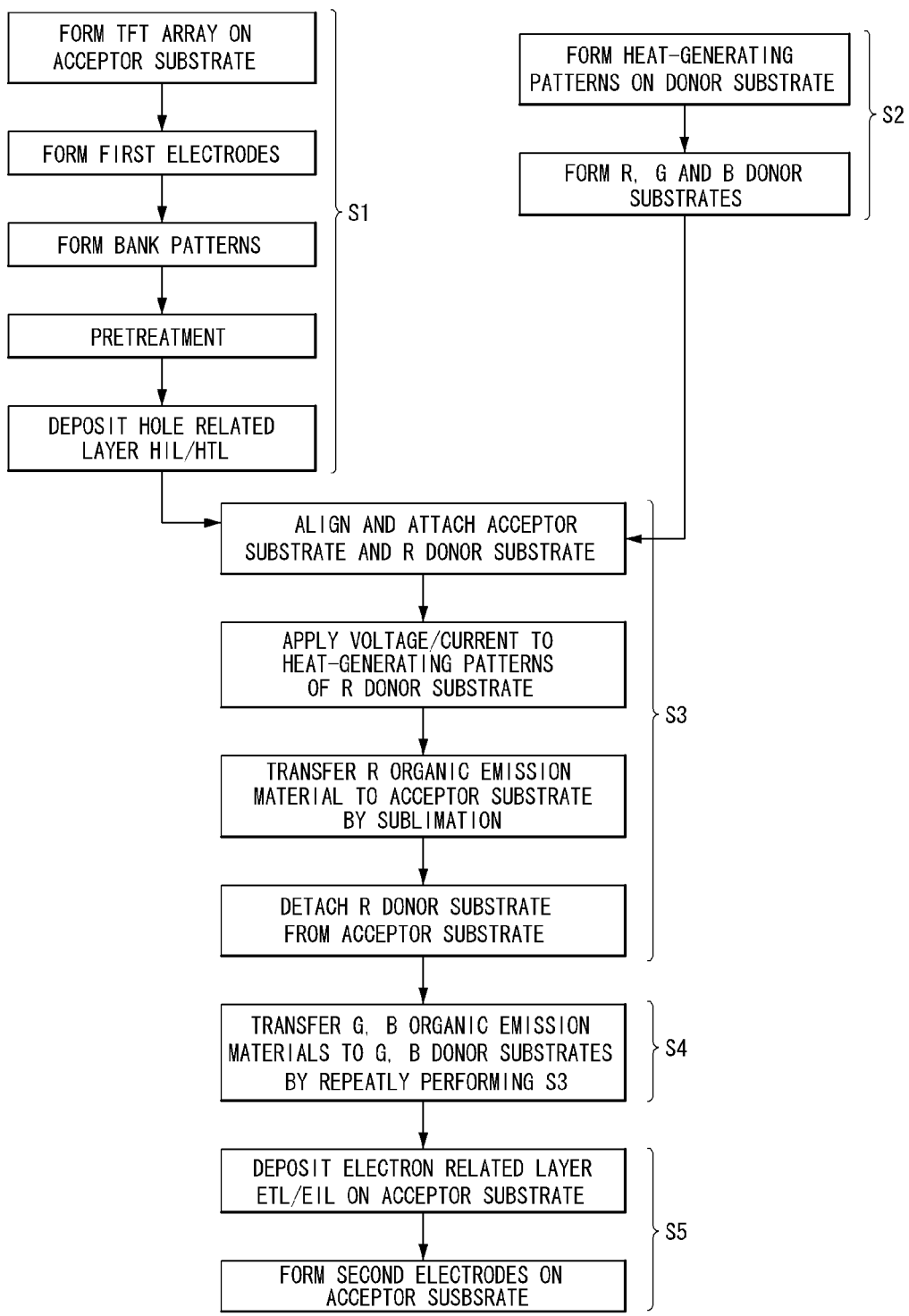
FIG. 2 is a flowchart illustrating a method of fabricating an OLED display according to one exemplary embodiment of the present invention.

As shown in FIG. 2, the present invention relates to a fabricating method of the OLED display comprising process S1 of forming an acceptor substrate including a first electrode, process S2 of forming red, green or blue donor substrate, process S3 of first attaching substrates and transferring organic emission material, process S4 of secondly attaching substrate and transferring organic emission material, and process S5 of forming an electron related layer and a second electrode. In below detailed description, the process S2 forming the donor substrates and the first and second attachment and transferring processes S3 and S4 are described where red, green and blue organic emission layers are sequentially formed on the acceptor substrate. This invention, however, is not limited thereto. The sequence of forming red, green and blue organic emission layers can be appropriately changed.

In the process S1 of forming the acceptor substrate according to some embodiments of the present invention, a thin film transistor array, the first electrode of the OLED, a bank pattern and hole related layers (e.g. a hole injection layer HIL and hole transport layer HTL) are formed on a first substrate.

In the process S2 of forming the donor substrates according to additional embodiments of the present invention, three substrates are prepared. Heat-generating patterns are formed on each of second to fourth substrates. The red, green and blue donor substrates are manufactured by forming red, green and blue organic emission materials on the second to fourth substrate.

In the first attachment and transferring process S3 according to yet additional embodiments of the present invention, the acceptor substrate is aligned with and attached to the red donor substrate. If voltage or current is applied to the heat-generating patterns of the red donor substrate, the heat-generating patterns generate joule heat to sublimate the red organic emission material. The sublimated red organic emission material is transferred to the acceptor substrate to form a red organic emission layer.

In the second attachment and transferring process S4 according to further embodiments of the present invention, the green and blue organic emission materials are formed on the acceptor substrate on which the red organic emission layer using the same process as forming the red organic emission layer.

In the process S5 of forming the electron related layer and the second electrode according to yet further embodiments of the present invention, the electron related layer and the second electrode are sequentially formed on the acceptor substrate on which the red, green and blue organic emission layer.

Hereinafter, the process S1 of forming the acceptor substrate is described further in detail with reference to FIGS. 3A to 3D.

Figure 3A:
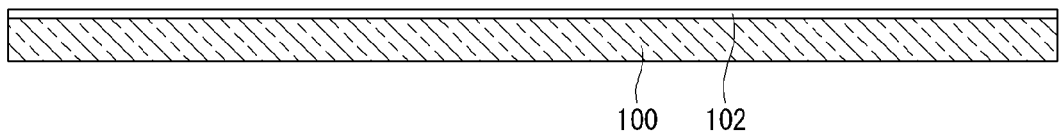
FIGS. 3A to 3D are sectional views illustrating exemplary procedures of forming a thin film transistor (TFT) array, first electrodes of the OLED, bank patterns, and a hole related layer on an acceptor substrate.
Figure 9A:
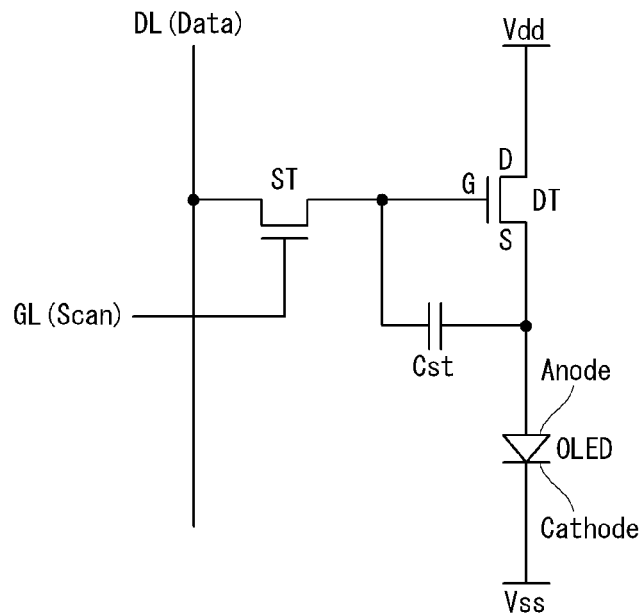
FIGS. 9A to 9C are equivalent circuit diagrams of pixels according to some embodiments of the present invention.
Figure 9B:
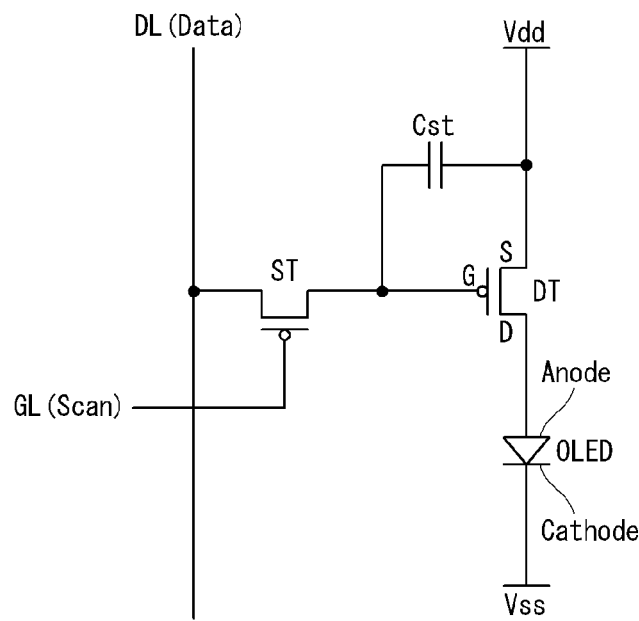
Figure 9C:
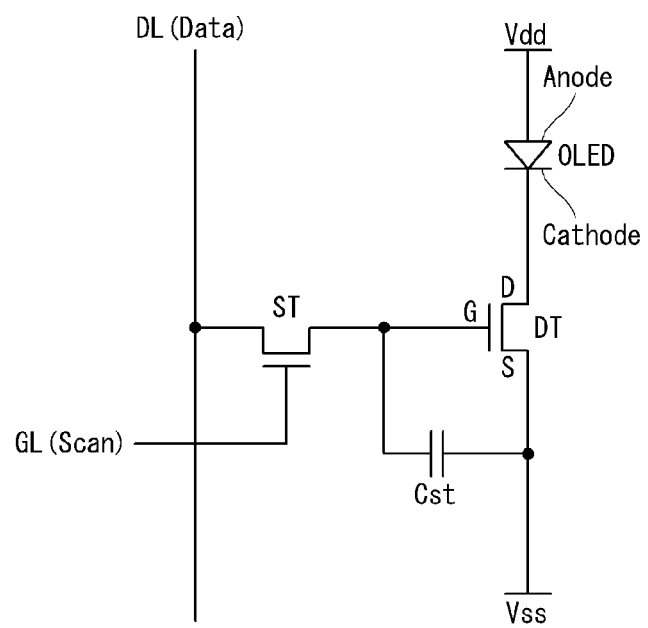

As shown in FIG. 3A according to some embodiments of the present invention, a TFT array 102 is formed on an acceptor substrate 100 made of a transparent material(s), including, but not limited to, glass and plastic. The TFT array 102 may comprise, as shown in FIGS. 9A to 9C, a gate line GL, a data line DL, a switching TFT ST, a driving TFT DT, a storage capacitor Cst, a voltage supply line Vdd, and a ground voltage supply line Vss. Further, the switching and driving TFTs ST and DT may be implemented by N type MOSFETs, but is not limited thereto. For example, the TFTs may be implemented by P type MOSFETs as shown in FIG. 9B. The equivalent circuits of pixels shown in FIGS. 9A to 9C are formed by two transistors and one capacitor as an example, but the TFT array structure according to the present invention is not limited thereto. The TFT array 102 may comprise a passivation layer for protecting the TFT array from the external environment, an overcoat layer for removing a step difference caused by the TFTs ST and DT, and a buffer layer for shielding out-gasing from the overcoat layer, but, for simplicity of the description, they are omitted from the figures.

Figure 3B:
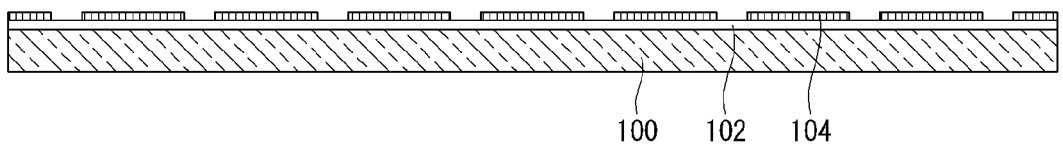

As shown in FIG. 3B according to additional embodiments of the present invention, first electrodes 104 of the OLED are formed on the acceptor substrate 100 provided with the TFT array 102. Each of the first electrodes 104 is connected to one electrode of the driving TFT DT through the buffer layer, the overcoat layer and the passivation layer (not shown). The first electrodes 104 may be anode electrodes having reflective layers, or cathode electrodes depending on a structure connected with the driving TFT DT. For example, in FIG. 9A, the first electrode 104 is an anode electrode Anode connected to a source electrode S of the driving TFT DT, and, in FIG. 9B, the first electrode 104 is an anode electrode connected to a drain electrode D of the driving TFT DT. In addition, in FIG. 9C, the first electrode 104 is a cathode electrode connected to the drain electrode D of the driving TFT DT.

Hereinafter, the first electrode 104 is assumed to be the anode electrode having a reflective layer. The first electrode 104 is a transparent conductor formed of an oxide, including, but not limited to, Indium Tin Oxide (ITO) and Indium Zinc Oxide (IZO), and is patterned for each pixel on the reflective layer containing opaque metal materials. The first electrode 104 supplies holes, which are supplied via the driving TFT. DT, to organic emisssion layers via hole related layers HIL and HTL described later.

Figure 3C:
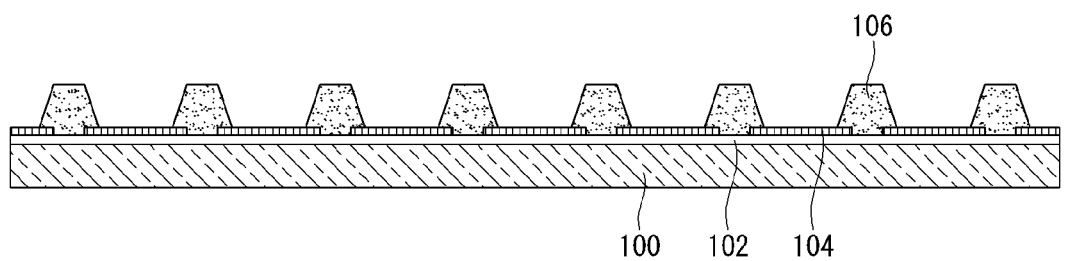

As shown in FIG. 3C according to yet additional embodiments of the present invention, bank patterns 106 are formed on the acceptor substrate 100 provided with the anode electrodes 104. The bank patterns 106 are formed at boundary regions between pixels to partition opening regions of the pixels. After the bank patterns 106 are formed on the acceptor substrate 100, a pretreatment process is performed using plasma. The pretreatment process can remove alien materials from the acceptor substrate 100 before depositing the organic emission layers of the OLED.

Figure 3D:
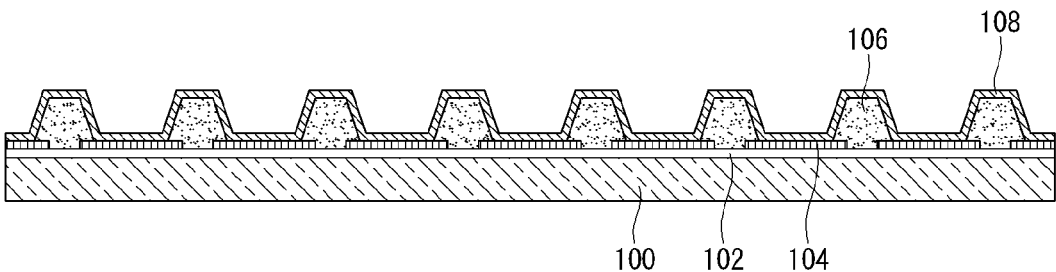

As shown in FIG. 3D according to further embodiments of the present invention, a hole injection layer material and a hole transport layer material are consecutively entirely deposited on the acceptor substrate 100 provided with the bank patterns 106, by the thermal evaporation, thereby forming a hole related layer 108 including the hole injection layer and the hole transport layer.

Next, the processes S2 of forming the donor substrates will be described further in detail with reference to FIGS. 4A to 4E.

Figure 4A:
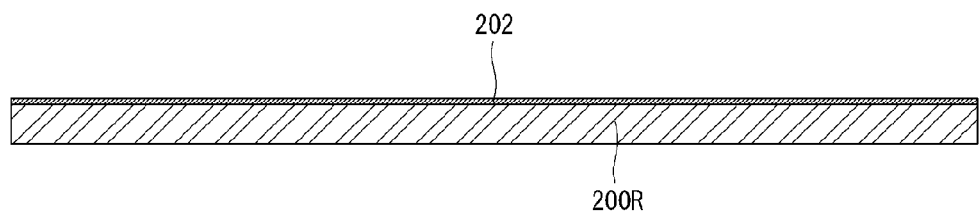
FIGS. 4A to 4E are sectional views illustrating exemplary procedures of forming red, green and blue donor substrates having heat-generating patterns and organic emission material layers, respectively.

As shown in FIG. 4A according to some embodiments of the present invention, a first heat-generating material 202 is formed on an entire surface of a first donor substrate 200R made of a transparent material(s), including, but not limited to, glass and plastic. The first heat-generating material 202 may be formed using a method, including, but not limited to, a chemical vapor deposition (CVD) process, a sputtering process, an electron beam process, an electrolysis/electroless plating. The size of the first donor substrate 200R may be equal to or greater than the size of the acceptor substrate 100. The first heat-generating material 202 may be made of any one, two or more alloy selected from the group consisting of Ag, Au, Al, Cu, Mo, Pt, Ti, W, and Ta, which can generate heat by application of voltage, but not limited thereto.

Figure 4B:
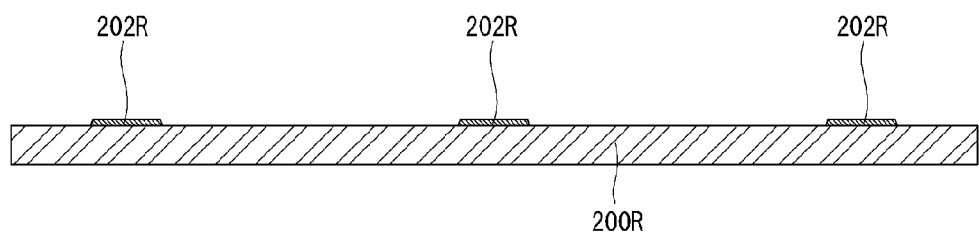

As shown in FIG. 4B according to additional embodiments of the present invention, first heat-generating patterns 202R are formed by patterning the first heat-generating material 202 entirely deposited on the first donor substrate 200R using a process, including, but not limited to photolithography process, a wet etching and a dry etching. The first heat-generating patterns 202R are formed corresponding to pixels of the acceptor substrate 100 to which organic emission material will be transferred. The width of each of the first heat-generating patterns 202R formed on the first donor substrate 200R may be equal to or smaller than a value obtained by summing the width of each pixel on the acceptor substrate 100 and the width of the bank pattern 106 which partitions adjacent pixels. The thickness of each of the first heat-generating patterns 202R may be about 1 µm or less in consideration of a resistance component which generates joule heat. As used herein, the term "about" refers to a range of values ±10% of a specified value. For example, the phrase "about 1 µm" includes ±10% of 1 µm, or from 0.9 µm to 1.1 µm.

Figure 4C:
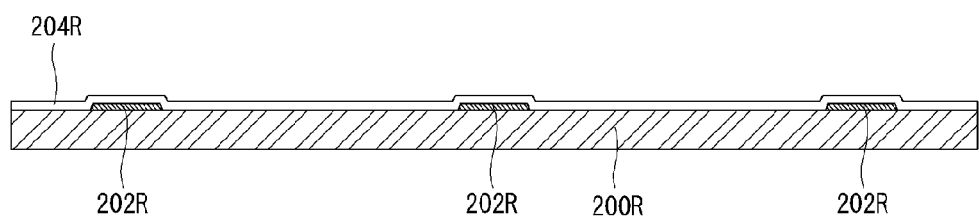

As shown in FIG. 4C according to some embodiments of the present invention, a red organic emission material layer 204R is entirely deposited, by the thermal evaporation or the like, on the first donor substrate 200R where the first heat-generating patterns 202R are formed. According to the processes of FIGS. 4A to 4C, it is possible to obtain a red donor substrate having the red R organic emission material 204R formed on the first heat-generating patterns 202R. The first heat-generating patterns 202R are formed to correspond with positions of the acceptor substrate 100 on which red pixels will be formed.

In order to prevent the first heat-generating patterns 202R generating joule heat from being oxidized or diffused to the red organic emission material 204R, an insulating layer may be optionally formed between the first heat-generating patterns 202R and the red organic emission material pattern 204R. The insulating layer may be formed of a material, including, but not limited to, silicon oxide, a silicon nitride, and a silicon oxide-nitride, and entirely deposited on the first heat-generating patterns 202R. Further, the insulating layer may employ a material used in the SOG (spin-on-glass) and may be entirely deposited on the first heat-generating patterns 202R through the heat treatment after spin coating.

Figure 4D:
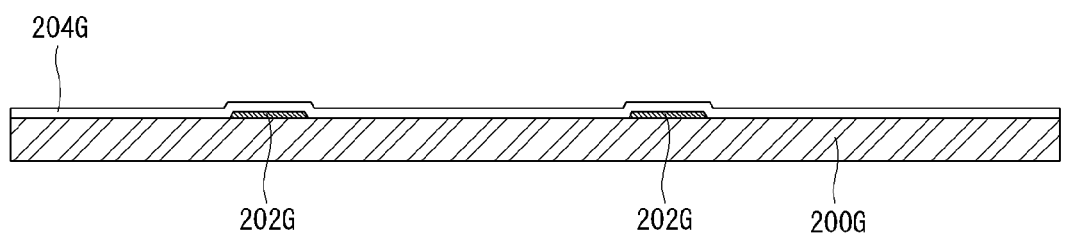

As shown in FIG. 4D according to some embodiments of the present invention, a green organic emission material is entirely deposited, by the thermal evaporation or the like, on a second donor substrate 200G where second heat-generating patterns 202G are formed, thereby forming a green donor substrate. The second heat-generating patterns 202G are formed using the same method as forming the first heat-generating patterns 202R shown in FIGS. 4A and 4B.

Figure 4E:
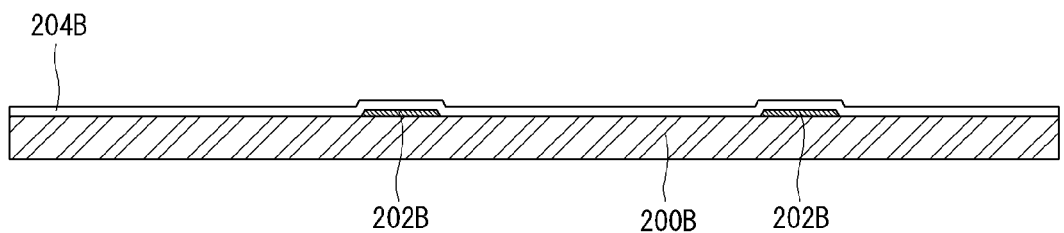

As shown in FIG. 4E according to some embodiments of the present invention, a blue organic emission material is entirely deposited, by the thermal evaporation or the like, on a third donor substrate 200B where third heat-generating patterns 202B are formed, thereby forming a blue donor substrate. The third heat-generating patterns 202B are formed using the same method as method of forming the first heat-generating patterns 202R shown in FIGS. 4A and 4B.

Subsequently, the attachment and transfer processes S3 and S4 will be described further in detail with reference to FIGS. 5A to 7B.

Figure 5A:
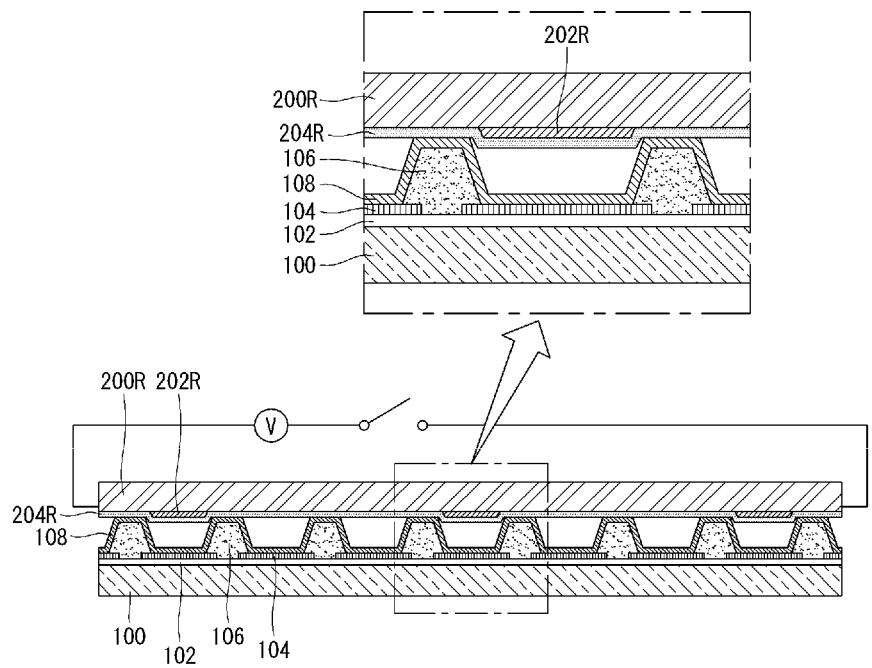
FIGS. 5A to 5B are sectional views illustrating exemplary procedures of forming a red emission layer by the attachment and transfer.

As shown in FIG. 5A according to some embodiments of the present invention, the acceptor substrate 100 provided with the hole related layer 108 is aligned with and attached to the red donor substrate 200R provided with the red organic emission material layer 204R. These alignment and attachment are performed under a vacuum or inert gas (Ar, $N_2$, etc.) atmosphere so as to protect the red organic emission material from moisture and/or oxygen. The attachment may be performed by a process, such as mechanical pressing.

Figure 5B:
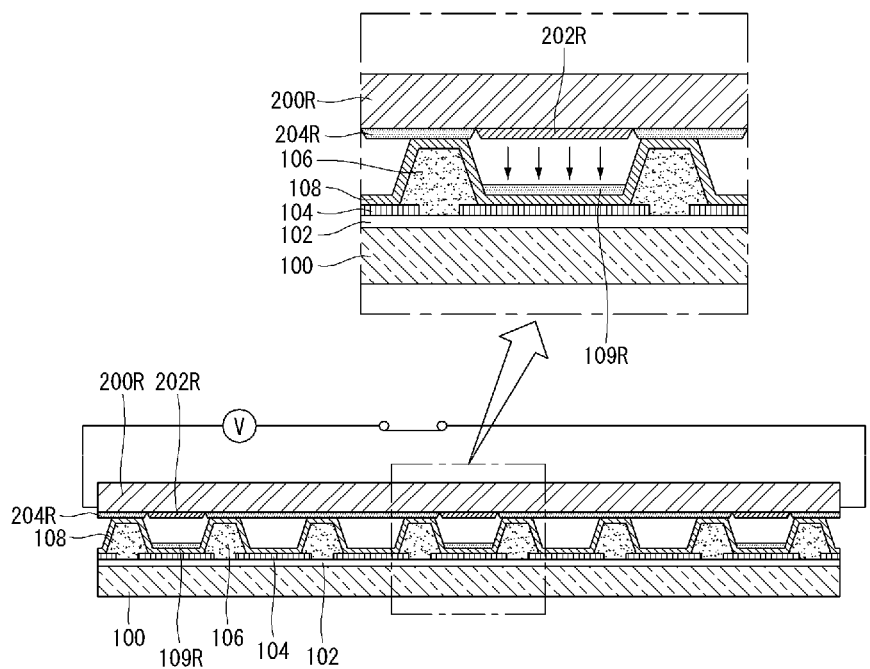

As shown in FIG. 5B according to additional embodiments of the present invention, an external voltage V is applied to the first heat-generating patterns 202R on the red donor substrate 200R after the alignment and the attachment are completed. By the application of the voltage V, the first heat-generating patterns 202R generate joule heat and in turn the red emission material 204R sublimates. As a result, the red organic emission material 204R on the first heat-generating patterns 202R is transferred onto the red pixel regions on the acceptor substrate 100 to form the red organic emission layers 109R.

Figure 6A:
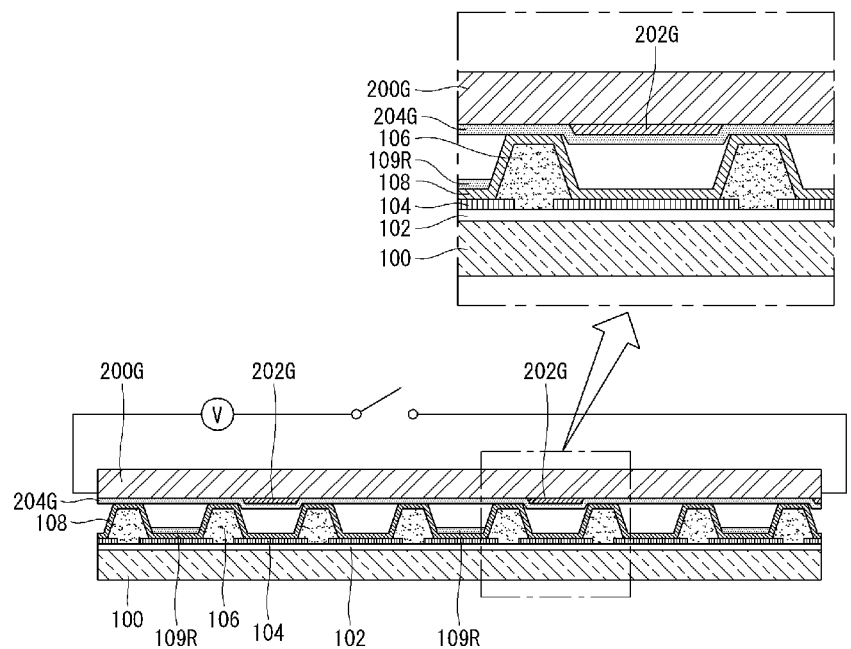
FIGS. 6A to 6B are sectional views illustrating exemplary procedures of forming a green emission layer by the attachment and transfer.

As shown in FIG. 6A according to yet additional embodiments of the present invention, the acceptor substrate 100 having the hole related layer 108 and the red organic emission layer 109R is aligned with and attached to the green donor substrate 200G provided with the green organic emission material 204G. These alignment and attachment are performed under a vacuum or inert gas (Ar, N2, etc.) atmosphere so as to protect the organic material pattern from moisture and/or oxygen. The attachment may be performed by a process, such as a mechanical pressing.

Figure 6B:
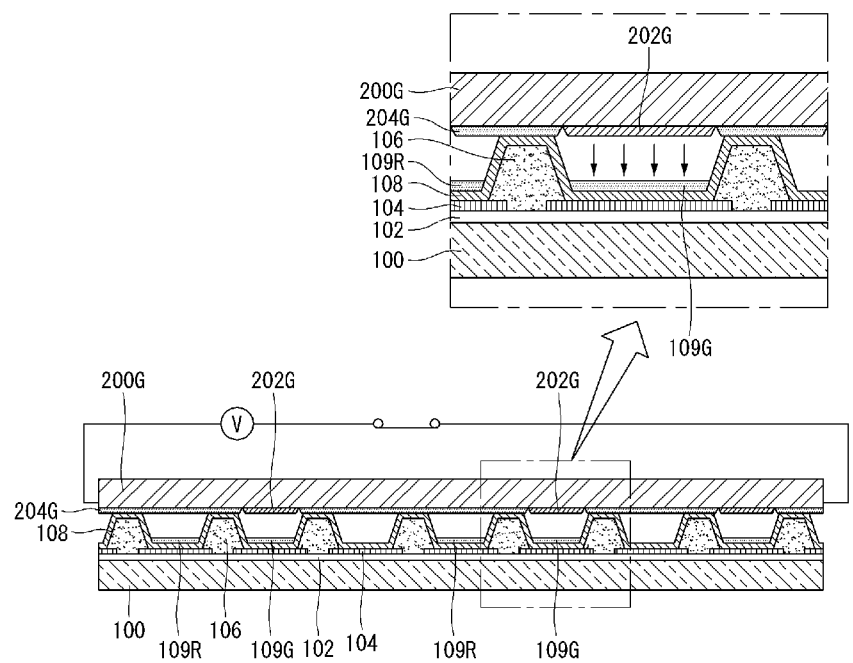

As shown in FIG. 6B according to further embodiments of the present invention, the external voltage V is applied to the second heat-generating pattern 202G on the green donor substrate 200G after the alignment and the attachment are completed. By the application of the voltage V, the second heat-generating patterns 202G generate joule heat and in turn the green organic emission material 204G sublimates. As a result, the green emission material pattern 204G on the second heat-generating patterns 202 is transferred onto the green pixel regions on the acceptor substrate 100 to form the green organic emission layers 109G.

Figure 7A:
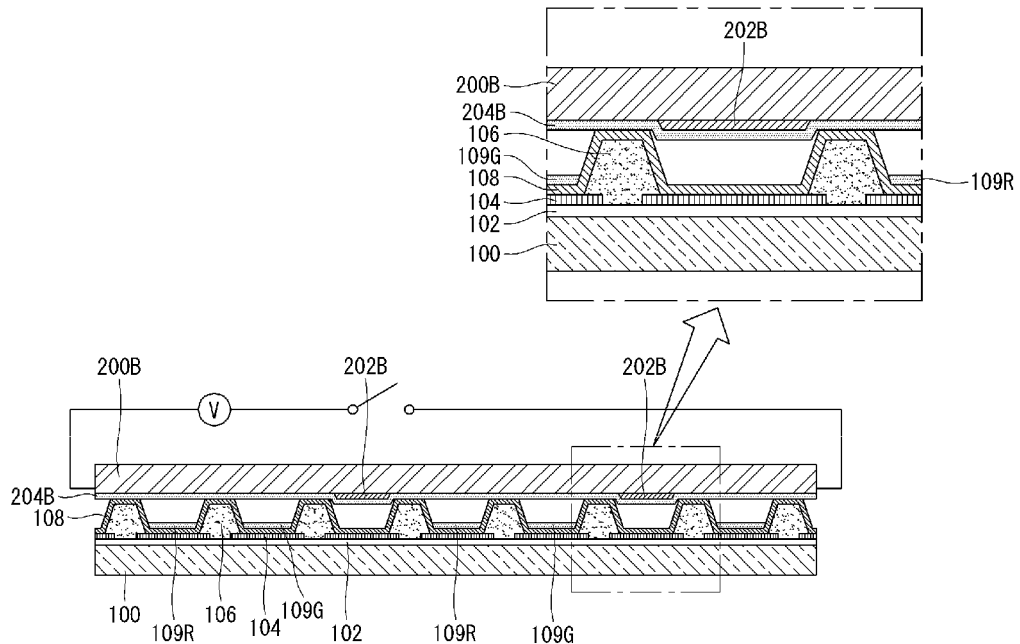
FIGS. 7A to 7B are sectional views illustrating exemplary procedures of forming a blue emission layer by the attachment and transfer.

As shown in FIG. 7A according to some embodiments of the present invention, the acceptor substrate 100 having the hole related layer 108, the red organic emission layers 109R, and the green organic emission layer 109G are aligned with and attached to the green donor substrate 200B provided with the green organic emission material 204B. These alignment and attachment are performed under a vacuum or inert gas (Ar, N2, etc.) atmosphere so as to protect the organic material pattern from moisture and/or oxygen. The attachment may be performed by a process, such as mechanical pressing.

Figure 7B:
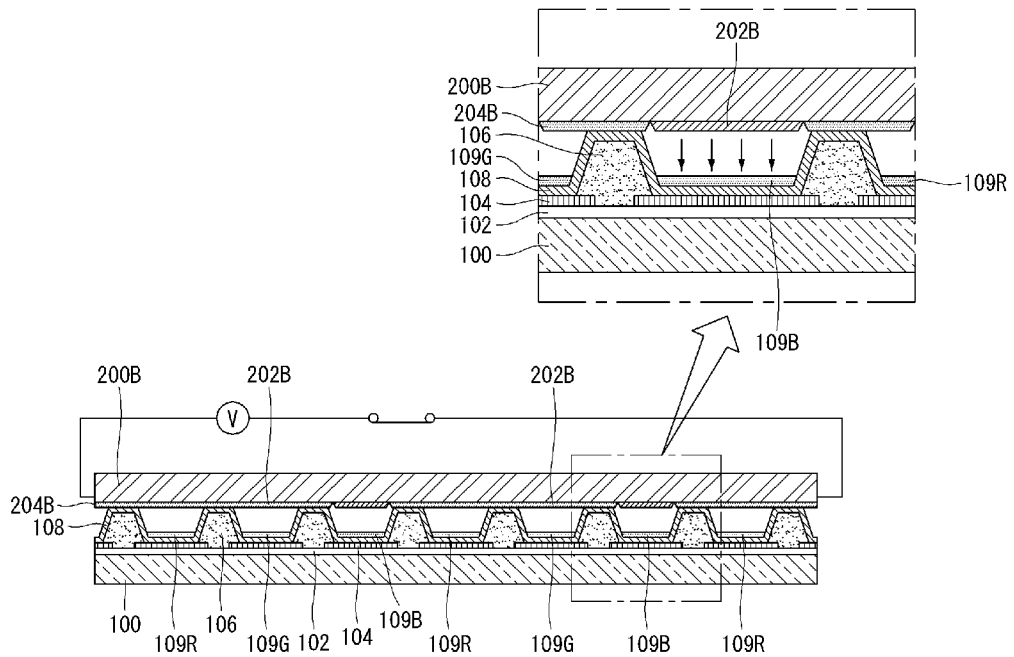

As shown in FIG. 7B according to additional embodiments of the present invention, the external voltage V is applied to the third heat-generating pattern 202B on the blue donor substrate 200B after the alignment and the attachment are completed. By the application of the voltage V, the third heat-generating patterns 202B generate joule heat and in turn the blue organic emission material 204B sublimates. As a result, the blue organic emission material layer 204B on he third heat-generating patterns 202B is transferred onto the blue pixel regions on the acceptor substrate 100 to form the blue organic emission layers 109B.

In the above embodiments, although it has been described as the case where the red, green and blue organic emission layers are sequentially formed, but the present invention is not limited thereto. It is also possible to appropriately change order of forming the red, green and blue organic emission layers. Further, it is possible to appropriately change the colors of the emission layers.

Since the acceptor substrate 100 and each of the donor substrates are close to each other with the bank patterns 106 therein, it is possible not only to prevent a color mixing phenomenon caused by the transfer being deviated to other pixel regions or being spread, but also to accurately control positions where the organic emission layers are formed. Also, since each of the red, green and blue organic emission layers 109R, 109G, and 109B is formed at a same time by the application of voltage, there is an advantage in that it is possible to save time which is wasted by the sequential scanning like the laser induced thermal imaging. Thus, the fabrication process is simple and the fabrication time is considerably shortened.

When the organic emission materials are exposed to a high temperature for a long time, they typically are denatured or their chemical bonds are destroyed. Therefore, in order to prevent the thermal denaturalization of the organic emission materials, an application time of the voltage applied to the first to third heat-generating patterns 202R, 202G and 202B may be in a range of about 0.1 µs to about 1 s, and a power density of the voltage applied to the first to third heat-generating patterns 202R, 202G and 202B may be in a range of about 0.1 W/cm$^2$ to about 10000 W/cm$^2$. The voltage applied to the first to third heat-generating patterns 202R, 202G and 202B may be of a direct current type or an alternating current type, and may be applied at several times intermittently.

The processes S5 of forming an electron related layer ETL/EIL and a second electrode on the acceptor substrate on which the red, green and blue organic emission layers 109R, 109G and 109B are formed will be described further in detail with reference to FIGS. 8A and 8B.

Figure 8A:
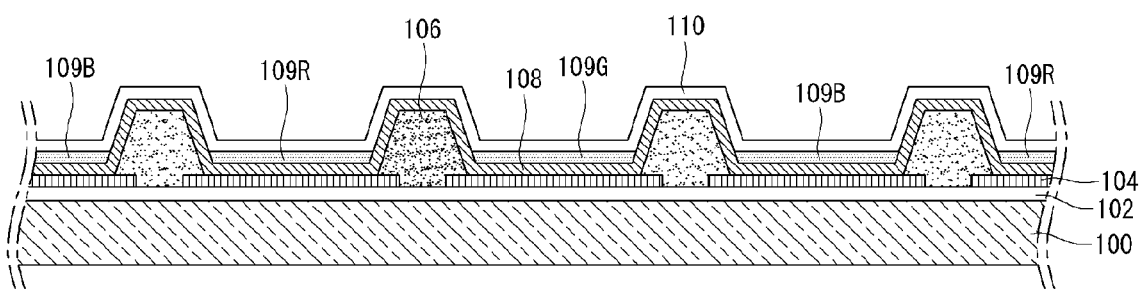
FIGS. 8A to 8B are sectional views illustrating exemplary procedures of forming an electron related layer and second electrodes of the OLED.

As shown in FIG. 8A according to some embodiments of the present invention, the electron related layer is formed on the acceptor substrate 100 on which the red, green and blue organic emission layer 109R, 109G and 109B are formed by consecutively entirely depositing an electron injection layer EIL material and an electron transport layer ETL material on the acceptor substrate 100 using a process, such as the thermal evaporation. The hole related layer 108, the red, green and blue organic emission layers 109R, 109G and 109B constitute the organic compound layer of the OLED.

Figure 8B:
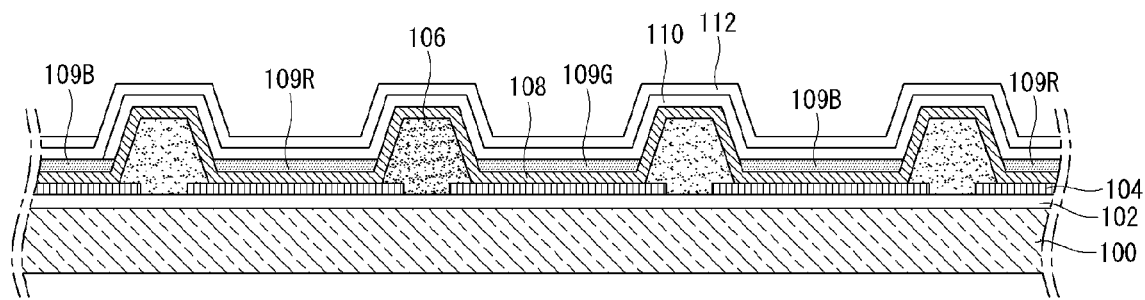

As shown in FIG. 8B according to additional embodiments of the present invention, a second electrode 112 of the OLED is formed on an entire surface of the acceptor substrate 100 provided with the electron related layer 110. The second electrode 112, which is a cathode electrode, may be a single layer made of a metal material, or may be formed of multi-layers comprising first and second metal layers which are disposed between dielectric layers. The second electrode 112 applies electrons supplied via the voltage supply line Vss to the organic compound layer as shown in FIGS. 9A to 9C.

The red, green and blue organic emission layer 109R, 109G and 109B in the OLED display according to some embodiments are formed by mixing at least two organic materials. Each of the red, green and blue organic emission layers 109R, 109G and 109B may be uniformly formed on each of the R, G and B donor substrates by depositing at least two organic materials mixed in a predetermined proportion using a thermal evaporation method before the transfer process is performed. As thus, the organic materials formed on the R, G and B donor substrates are maintained at a uniform mixing state before the transfer process is performed. If thermal properties of the at least two organic materials constituting of the mixture are different from each other, however, the at least two organic materials are transferred onto the acceptor substrate in a different speed according to the thermal property of each organic material. Thus, the at least two organic materials transferred onto the acceptor substrate are in a non-uniform state.

This phenomenon is because an organic material having a lower sublimation temperature is transferred onto the acceptor substrate faster than another organic material having a higher sublimation temperature. Because efficiency, lifetime and color property of the OLED are degraded when the mixture of the organic materials transferred onto the acceptor substrate is in a non-uniform state, it is necessary for the mixture of the organic materials to be uniformly distributed on the acceptor substrate.

The inventors of the present invention have found that it is possible to prevent the mixture of the organic materials formed on the acceptor substrate from being non-uniformly formed by controlling sublimation temperature Ts of the organic materials according to equations 1 and 2 below.

$$|Ts(A)-Ts(B)|<50° C.$$ [Equation 1]

$$|Ts(A)-Ts(B)|<50° C., |Ts(A)-Ts(C)|<50° C., |Ts(B)-Ts(C)|<50° C.$$

The equation 1 is applied in case that the organic emission layer is formed using two organic materials, and the equation 2 is applied in case that the organic emission layer is formed using three organic materials. In the equation 1 and 2, A is a host material to form the organic emission layer, and B and C are dopant materials to form the organic emission layer. The sublimation temperature Ts(A) of the host material A and sublimation temperatures Ts(B) and Ts(C) of the dopant materials B and C are temperatures measured in the thermal evaporation device when the host and dopant materials A, B and C are reached to a specific sublimation rate while the host and dopant materials A, B and C received in a crucible of the thermal evaporation device are heated. From the equations 1 and 2, it is possible to know that at least two organic materials can be uniformly formed on the acceptor substrate before and after the transfer is completed when a difference of sublimation temperature between the at least two organic materials used as the organic emission layer of this invention is set to less than about 50° C.

Figure 10A:
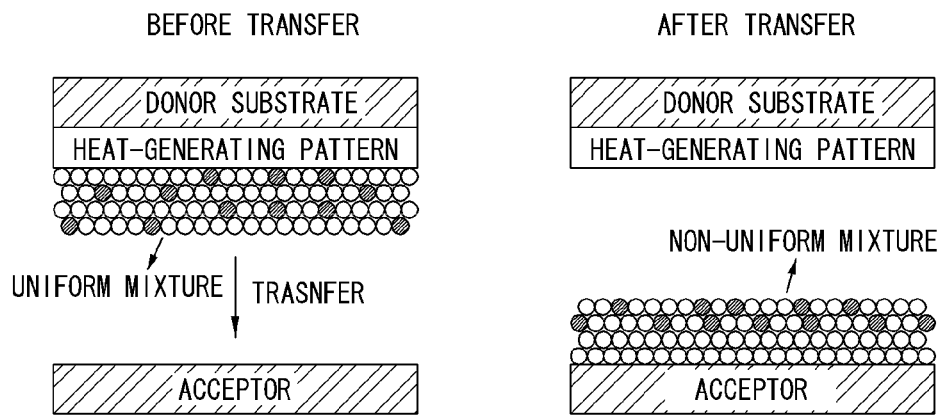
FIG. 10A is a conceptual view illustrating mixing states before and after a mixture of two organic materials (e.g. host material and dopant material) is transferred onto an acceptor substrate when a difference of sublimation temperatures between the two organic materials is equal or large than about 50° C.
Figure 10B:
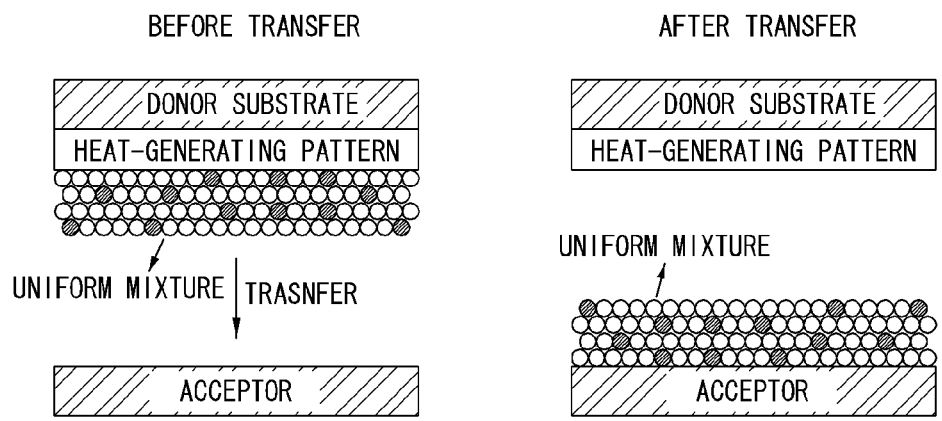
FIG. 10B is a conceptual view illustrating mixing states before and after a mixture of two organic materials (e.g. host material and dopant material) are transferred onto an acceptor substrate when a difference of sublimation temperatures between the two organic materials is less than about 50° C.

FIG. 10A is a conceptual view illustrating mixing states of two organic materials before and after the two organic materials (host material and dopant material) are transferred onto the acceptor substrate when a difference of sublimation temperature between the two organic materials is equal to or larger than about 50° C. FIG. 10A shows that two organic materials can be non-uniformly formed on the acceptor substrate after the transfer is completed although the two organic materials formed on the donor substrate are uniformly mixed before the transfer is completed. FIG. 10B is a conceptual view illustrating mixing states before and after a mixture of two organic materials (host material and dopant material) are transferred onto an acceptor substrate when a difference of sublimation temperature between the two organic materials is less than about 50° C. FIG. 10B shows that two organic materials can be uniformly formed on the acceptor substrate before and after the transfer is completed.

Subsequently, technical effects of this invention in some embodiments in which the green organic emission layer is formed by mixing the host material A expressed as a chemical formula 1, the dopant material B expressed as a chemical formula 2, and the dopant material C expressed as a chemical formula 3 is described below.

[chemical formula 1]

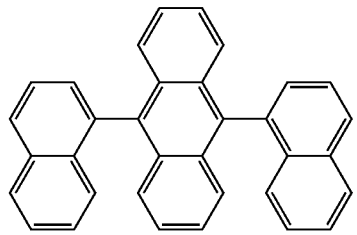

[chemical formula 2]

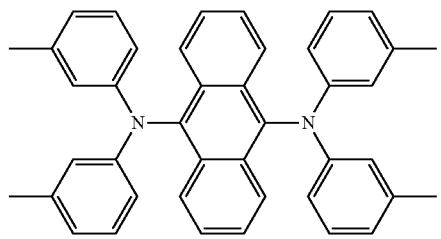

[chemical formula 3]

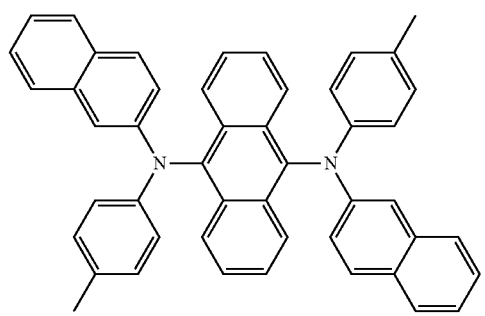

In chemical formulas 1 and 2, the sublimation temperature Ts(A) of the host material A is about 170° C., the sublimation temperature Ts(B) of the dopant material B is about 170° C., and the sublimation temperature Ts(C) of the dopant material C is about 250° C. The sublimation temperatures Ts(A), Ts(B) and Ts(C) of the host and dopant materials A, B and C are temperatures measured when the sublimation rates of the host and dopant materials A, B and C are reached at 0.1 Å/sec while a boron nitride crucible having a capacity of 5 cc in a vacuum chamber maintained at about 5×10⁻⁶ torr is heated in 10° C./min. In the boron nitride crucible, each 1 gram of the host and dopant materials A, B and C is filled.

In order to examine uniformity of the green organic emission layer formed on the acceptor substrate, green organic emission layers (examples 1 and 2) are formed using joule heat, and green organic emission layers (comparative examples 1 and 2) are formed using a conventional thermal evaporation. Hereafter, methods of manufacturing Examples 1 and 2, and comparative examples 1 and 2 are will be described.

Firstly, the host material A and the dopant material B are mixed each other for forming the green organic emission layer. Subsequently, the green organic emission layer is formed on the acceptor substrate according to the method shown in FIGS. 6A and 6B. Such green organic emission layer is referred to as example 1. The green organic emission layer of the example 1 is formed by transferring the mixture of the host material A (sublimation temperature 170° C.) and the dopant material B (sublimation temperature 170° C.) to the acceptor substrate using joule heat. The green organic emission layer of example 2 is formed using the same method as example 1. In the example 2, the sublimation temperature of the host material A is about 170° C. and the sublimation temperature of the dopant material C is about 250° C.

In order to compare with the examples 1 and 2 of the green organic emission layer according to this invention, the green organic emission layers of comparative examples 1 and 2 formed using the conventional thermal evaporation method are prepared. The green organic emission layer of comparative examples 1 is formed with the host material A and the dopant material B, and the green organic emission layer of comparative examples 2 is formed with the host material A and the dopant material C.

Table 1 shows a relationship of light emission efficiency between example 1 and comparative example 1, and a relationship of light emission efficiency between example 2 and comparative example 2.

TABLE 1

| light emission efficiency of example 1 to light emission efficiency of comparative example 1 | light emission efficiency of example 1 is about 74% of light emission efficiency of comparative example 1 |
|---|---|
| light emission efficiency of example 2 to light emission efficiency of comparative example 2 | light emission efficiency of example 2 is about 21% of light emission efficiency of comparative example 2 |

As shown in the table 1, the light emission efficiency of example 1 at 0° C. when the difference of the sublimation temperatures between the host material A and the dopant material B is less than about 50° C. is much higher than the light emission efficiency of example 2 at 80° C. when the difference of the sublimation temperature between the host material A and the dopant material C is equal to or larger than 50° C.

Figure 11A:
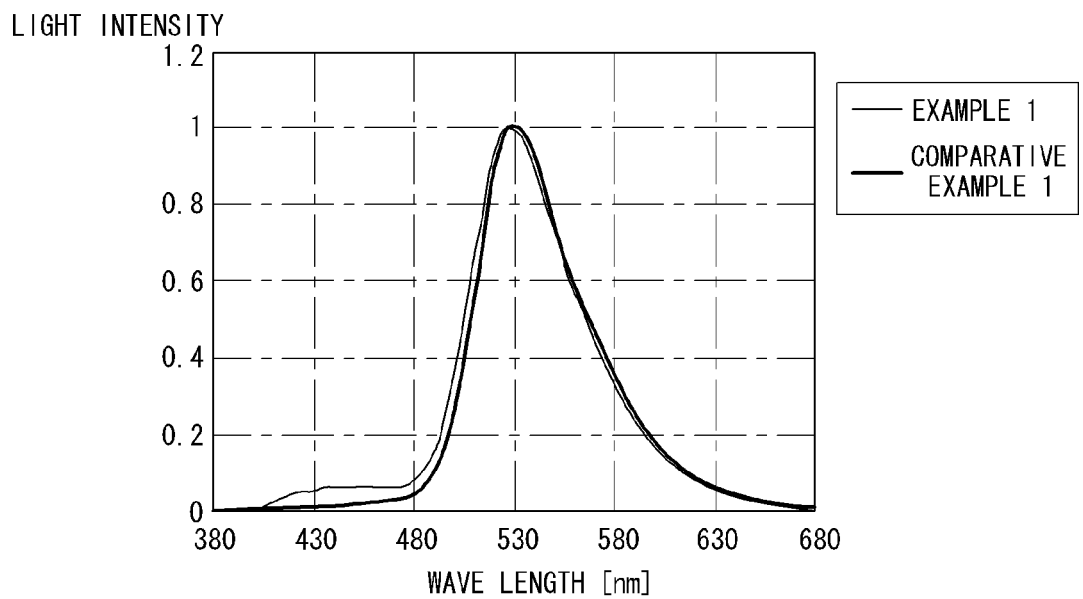
FIG. 11A is a graph illustrating spectra of organic emission layer according to an example 1 and a comparative example 1.
Figure 11B:
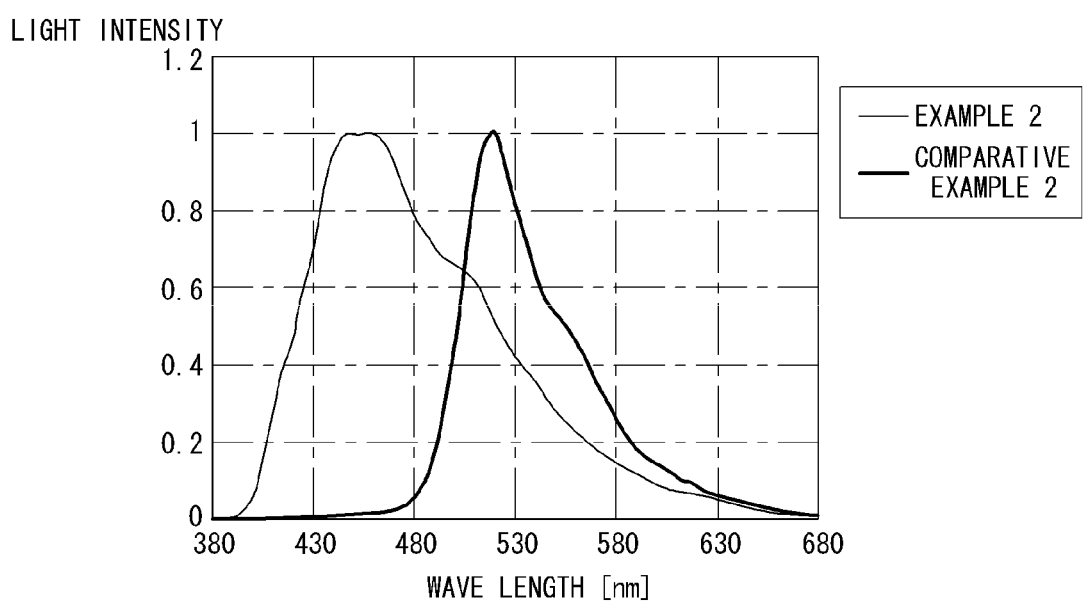
FIG. 11B is a graph illustrating spectra of organic emission layer according to an example 2 and a comparative example 2.

FIG. 11A is a graph illustrating spectra of the green organic emission layers according to the example 1 and the comparative example 1, and FIG. 11B is a graph illustrating spectra of the green organic emission layers according to example 2 and comparative example 2. In graphs of FIGS. 11A and 11B, x axis represents a wave length mm, and y axis represents a light intensity.

As shown in FIG. 11A, the distribution of spectrum of example 1 at 0° C. when the difference of the sublimation temperature between the host material A and the dopant material B is less than 50° C. is similar to comparative example 1 since the green organic emission layer formed on the acceptor is maintained in an uniform state. As shown in FIG. 11B, however, the distribution of spectrum of example 2 at 80° C. when the difference of the sublimation temperature between the host material A and the dopant material C is larger than 50° C. is different from comparative example 2 since the organic emission layer formed on the acceptor are maintained in a non-uniform state.

In above-mentioned embodiments, the green organic emission layers are described as examples, but this invention is not limited thereto. For example, the method of forming an organic layer by applying a mixture of at least two organic materials onto a donor substrate, and then transferring the mixture to an acceptor substrate using joule heat can be applied to this invention. Accordingly, if an electron related layer including an electron injection layer and an electron transport layer, and a hole related layer including a hole injection layer and a hole transport layer are formed by mixing at least two organic materials, it is possible to apply this invention in order to make the electron and hole related layers.

As described herein, according to one aspect of the present invention, it is possible to obtain an effect capable of quickly forming the organic emission layer having a high pattern precision on a large substrate because the organic emission layer of the OLED is formed by using joule heat. Accordingly, the organic emission layer according to the present invention is suitable for a large screen OLED display.

As described herein, according to another aspect of the present invention, it is possible for the mixture constituting the organic emission layer to be uniformly formed by appropriately setting the difference of sublimation temperatures between the at least two organic materials. Therefore, it is possible to obtain an OLED display with improved efficiency, color property, and lifetime.

One skilled in the art will readily recognize from the disclosures herein, the accompanying drawings and the claims that various modifications can be made without departing from the spirit and scope of the invention. For example, although some embodiments where the first and second electrodes are an anode electrode and a cathode electrode, respectively, has been described herein, the present invention is also applicable to a case where the first and second electrodes are a cathode electrode and an anode electrode, respectively. In this case, the hole related layer described in the embodiment may be replaced with an electron related layer, and the electron related layer described in the embodiment may be replaced with a hole related layer. Therefore, the scope of the invention is indicated by the appended claims rather than the foregoing description, and all changes that come within the meaning and range and equivalence thereof are intended to be embraced therein.

What is claimed is:

1. An organic light emitting diode (OLED) display comprising:
   first electrodes respectively connected to thin film transistors formed on a substrate;
   bank patterns formed on boundary regions between the first electrodes to partition opening regions of pixels;
   a first layer formed to cover all of the bank patterns and the first electrodes exposed between the bank patterns, wherein the first layer is a hole injection layer and/or a hole transport layer;
   organic emitting patterns formed on the first layer in the opening regions of the pixels defined by the bank patterns;
   a second layer formed to cover the organic emitting patterns and the first layer exposed between the organic emitting patterns; and
   second electrodes formed on the second layer to cross over the first electrodes, wherein the organic emitting patterns comprise a mixture of at least two organic materials, and wherein a difference of sublimation temperatures between the at least two organic materials is set to be less than 50° C.

2. The OLED display of claim 1, wherein the at least two organic materials are represented by chemical formulas 1 and 2:

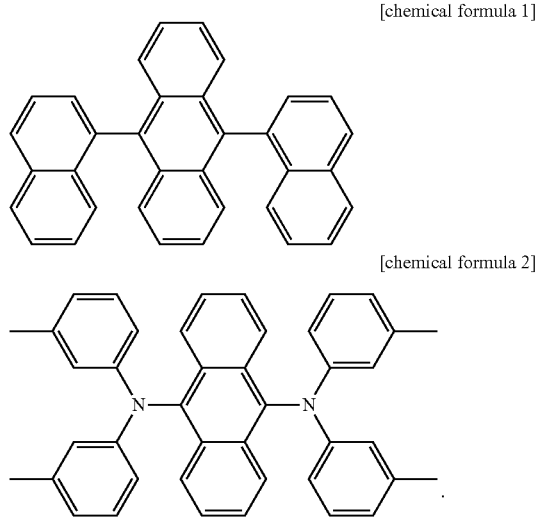

[chemical formula 1]

[chemical formula 2]

3. The OLED display of claim 1, wherein the second layer is an electron injection layer and/or an electron transport layer.

4. A method of fabricating an OLED display comprising a plurality of pixels according to claim 1, comprising the steps of:
forming a substrate comprising a first electrode,
forming a color donor substrate comprising an organic emission material and a heat-generating pattern,
attaching the substrate and the color donor substrate,
transferring the organic emission material from the color donor substrate to the substrate,
forming a color organic emission layer on the substrate, and
forming a second electrode on the color organic emission layer.

5. The method of claim 4, further comprising forming a hole related layer prior to forming the second electrode or prior to attaching the substrate and the color donor substrate.

6. The method of claim 4, further comprising forming an electron related layer prior to forming the second electrode or prior to attaching the substrate and the color donor substrate.

7. The method of claim 4, wherein the heat-generating pattern is formed corresponding to the pixels of the substrate to which organic emission material is transferred.

8. The method of claim 4, further comprising forming a bank pattern partitioning adjacent pixels, wherein the width of the heat-generating pattern is equal to or smaller than a value obtained by summing the width of each pixel on the substrate and the width of the bank pattern.

9. The method of claim 4, wherein the thickness of the heat-generating patters is about 1 μm or less.

10. The method of claim 4, further comprising forming an insulating layer between the heat-generating pattern and the organic emission material.

11. The method of claim 9, wherein the insulating layer comprises silicon oxide, silicon nitride, silicon oxide-nitride, or the mixture thereof.

12. The method of claim 4, wherein the organic emission layer comprises a mixture of at least two organic materials, and the at least two organic materials are chemical formulas 1 and 2:

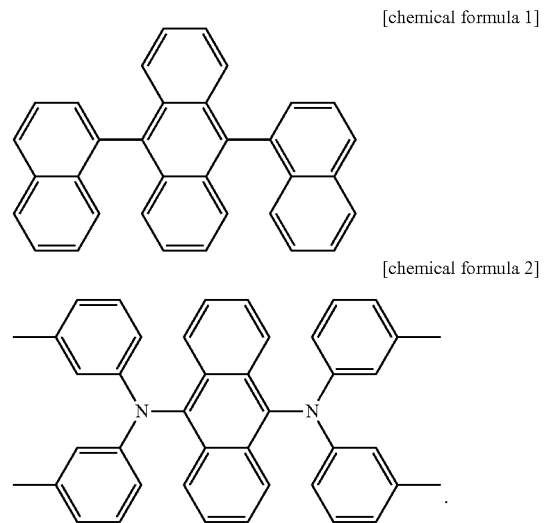

[chemical formula 1]

[chemical formula 2]

13. The method of claim 4, wherein the application time of the voltage applied is in a range of about 0.1 μs to about 1s, and a power density of the voltage applied is in a range of about 0.1 W/cm² to about 10000 W/cm².

14. The method of claim 4, wherein the attaching step is performed under a vacuum or inert gas atmosphere.

15. The method of claim 4, wherein the transferring step comprises applying voltage to the heat-generating pattern.

16. The method of claim 4, wherein the color donor substrate is red, green, or blue donor substrate, comprising red, green, or blue organic emission material, respectively.

17. The method of claim 5, wherein the step of forming the electron related layer comprises consecutively depositing an electron injection layer material and an electron transport layer material.

* * * * *